(12) United States Patent
Andersson et al.

(10) Patent No.: US 6,701,588 B2
(45) Date of Patent: Mar. 9, 2004

(54) PIN LOCK

(75) Inventors: Magnus Andersson, Lund (SE); Christian Trulsson, Lund (SE)

(73) Assignee: Sony Ericsson Mobile Communications AB, Lund (SE)

( * ) Notice: Subject to any disclaimer, the term of this patent is extended or adjusted under 35 U.S.C. 154(b) by 0 days.

(21) Appl. No.: 10/192,962

(22) Filed: Jul. 10, 2002

(65) Prior Publication Data

US 2003/0145441 A1 Aug. 7, 2003

Related U.S. Application Data

(60) Provisional application No. 60/355,308, filed on Feb. 7, 2002.

(51) Int. Cl.[7] .......................... A44B 21/00; E05B 73/00; E05C 9/00; F16B 21/00
(52) U.S. Cl. ............................. 24/652; 24/303; 24/654; 24/656; 24/662; 292/251.5
(58) Field of Search .......................... 24/652, 654, 656, 24/662, 664, 672, 629, 606, 303, 704.1, 704.2; 292/251.5

(56) References Cited

U.S. PATENT DOCUMENTS

| | | | | |
|---|---|---|---|---|
| ,444,019 A | * | 1/1891 | Damvig .................... 24/704.1 |
| 863,543 A | * | 8/1907 | Lomax ..................... 24/652 |
| 1,964,847 A | * | 7/1934 | Engler et al. .................. 40/125 |
| 3,210,820 A | * | 10/1965 | Humiston .................... 24/662 |
| 3,449,802 A | * | 6/1969 | Mackey ..................... 24/654 |
| 4,040,148 A | * | 8/1977 | Fukumoto .................... 24/108 |
| 4,745,664 A | * | 5/1988 | Damvig ..................... 24/704.1 |
| 5,061,112 A | * | 10/1991 | Monford, Jr. ............. 292/251.5 |
| 5,600,977 A | * | 2/1997 | Piron .......................... 70/57.1 |
| 5,704,100 A | * | 1/1998 | Swan .......................... 24/656 |
| 5,917,907 A | * | 6/1999 | Kela ........................... 379/446 |
| 6,059,156 A | * | 5/2000 | Lehtinen .................... 224/197 |

* cited by examiner

Primary Examiner—Victor Sakran
(74) Attorney, Agent, or Firm—Jenkens & Gilchrist, P.C.

(57) ABSTRACT

A fastening mechanism comprising a pin having a shank coupled to the head at a first end of said shank. A metallic pin-lock is provided having a base portion coupled to a resilient pin-engaging portion. The shank has a circumferentially-formed notch at a second end, said notch being adapted to receive the resilient pin-engaging portion. A resilient member is coupled to the base portion of the metallic pin-lock and to a mobile phone housing. A retainer is provided for housing said fastening mechanism inside the mobile phone housing. Upon insertion of the pin into the pin-lock, the pin is adapted to move the resilient pin-engaging portion a predetermined distance until the resilient pin-engaging portion engages the circumferentially-formed notch. The pin-lock is adapted to be removed from the pin via a magnet attracting at least a portion of the pin-lock away from the pin.

8 Claims, 5 Drawing Sheets

PIN LOCK

RELATED APPLICATION(S)

This patent application claims the benefit of priority from, and incorporates by reference the entire disclosure of, U.S. Provisional Patent Application Serial No. 60/355,308, which was filed on Feb. 7, 2002.

TECHNICAL FIELD

The present invention relates in general to a mobile phone interlocking mechanism, and in particular but not by way of limitation, to a pin interlocking mechanism that is adapted to release upon application of a magnet thereon.

BACKGROUND OF THE INVENTION

A mobile phone typically has a housing surrounding electronic components, including a battery and other electronic components therein. In some mobile phone applications, the battery may be externally coupled to the mobile phone housing. The housing, which is typically made of a plastic or thermoplastic material, may consist of multiple components that are typically coupled together using screws, which are threaded, or snaps. In mobile phone applications where the battery is externally located from the mobile phone housing, a battery lock is provided at one end of the battery to couple the battery to the mobile phone housing. To open the mobile phone housing, threaded screws may be removed by a screwdriver and the like.

Because prior art fastening mechanisms, such as those used in the mobile phone industry, are typically small relative to the housing which is being fastened, the fasteners tend to come loose. The threads in the housing are also prone to wear, and typically fail to function after several uses. Those housings which may be snap-fitted together are typically designed for permanent fastening. Accordingly, when these snap-fits are released through the use of specially designed tools, the phone housing will not be in condition for re-assembly. The special tools utilized also are known to damage the housing of the mobile phone, thus making the separation of the housing components costly and undesirable.

SUMMARY OF THE INVENTION

To solve these problems and other problems of the prior art, a fastening mechanism for mobile phones is provided. The fastening mechanism may include a pin having a substantially-cylindrical shaped head. A shank is coupled to the substantially-cylindrical shaped end at a first end of the shank. A locking portion is provided on the shank proximal to a second end of the shank.

A pin-engaging mechanism and a base are provided to engage the locking portion of the shank and secure the fastening mechanism in a fixed relationship. A resilient member, such as a spring, may be provided coupled to the base to allow some flexibility in the interlocking relationship between the pin and the pin-engaging mechanism. The resilient member is preferably constructed of a metallic material adapted to be influenced by a magnet externally applied thereto.

Accordingly, two mobile phone housing components may be coupled together through the use of the pin and the pin-engaging member. The pin may fit through a pre-designed orifice in a first housing component and couple with the pin-engaging mechanism, which is coupled to the second housing component, and fixedly secure the first and second housing components.

To disconnect the housing components, a magnet may be applied to the base to pull the base away from the pin. The force provided by the magnet may tilt the base and the pin-engaging mechanism away from the pin, and thereby disconnect the pin-engaging mechanism from the pin.

The pin may be hidden inside one of the housing components, thereby removing the interconnection components from visibility by a user of the product. However, should aesthetics require visibility of the pin, the pin may be coupled to an external surface of the first housing prior to coupling with the second housing.

BRIEF DESCRIPTION OF THE DRAWINGS

A more complete understanding of the method and apparatus of the present invention may be obtained by reference to the following Detailed Description when taken in conjunction with the accompanying Drawings wherein.

DETAILED DESCRIPTION

Figure 1:
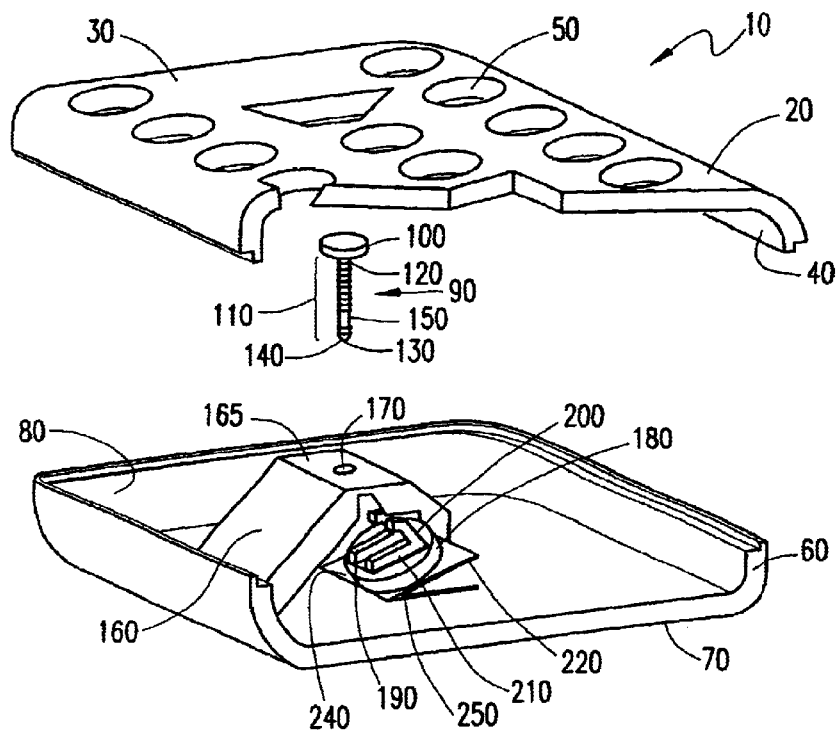
FIG. 1 is an exploded view of one embodiment of the pin lock mechanism according to the principles of the present invention.

The present invention provides an economical, convenient coupling mechanism adapted to secure housing components of mobile phones. Two housing components of a mobile phone may be conveniently coupled through the use of the pin, pin-engaging mechanism and base. Decoupling the housing components may be accomplished through the application of an external magnet in the general vicinity of the base to separate the pin-engaging mechanism from the pin. The coupling and decoupling may occur many times without wear on the components. The coupling mechanism may be internally located to limit visibility thereof Referring now to the drawings, and more particular to FIG. 1, an exploded view of a mobile phone housing assembly 10 is shown. The mobile phone housing assembly 10 includes a first housing portion 20 having an external surface 30 and an internal surface 40. The first housing portion 20 may be provided with a plurality of orifices 50 for indicia, phone number locations, display locations, and the like. A second housing portion 60 adapted to mate with the first housing portion 20 is also provided. The second housing portion 60 includes an external surface 70 and an internal surface 80.

A pin 90 couples the first housing portion 20 to the second housing portion 60. The pin 90 may include a head 100, which in certain embodiments may be substantially-cylindrical. A shank 110 having a first end 120 and a second end 130 is coupled to the head 100 at the first end 120. In certain embodiments discussed in more detail below, the second end 130 may be provided with tapers 140. Proximal to the second end 130, a locking portion 150 is provided on the shank 110. In this embodiment, the head 100 is adapted to fixedly secure to the first housing portion 20 and is not visible from the external surface 30 of the first housing portion 20.

Still referring to FIG. 1, a pin-lock housing 160 is provided on the internal surface 80 of the second housing portion 60. The pin-lock housing 160 includes a top surface 165 having a pin-orifice 170 thereon adapted to receive the pin 90 therethrough. Secured within the pin-lock housing 160 is a pin lock 180. The pin lock 180 includes a pin-engaging mechanism 190, which in certain embodiments may be a pair of substantially vertically disposed legs 200, and a metallic base portion 210. A resilient member 220 may be provided coupled to the base portion 210. As shown in FIG. 1, the resilient member 220 is an angle 230 having a first end 240 in a first plane and a second end 250 coupled to the second housing portion 60 in a second plane.

Figure 2:
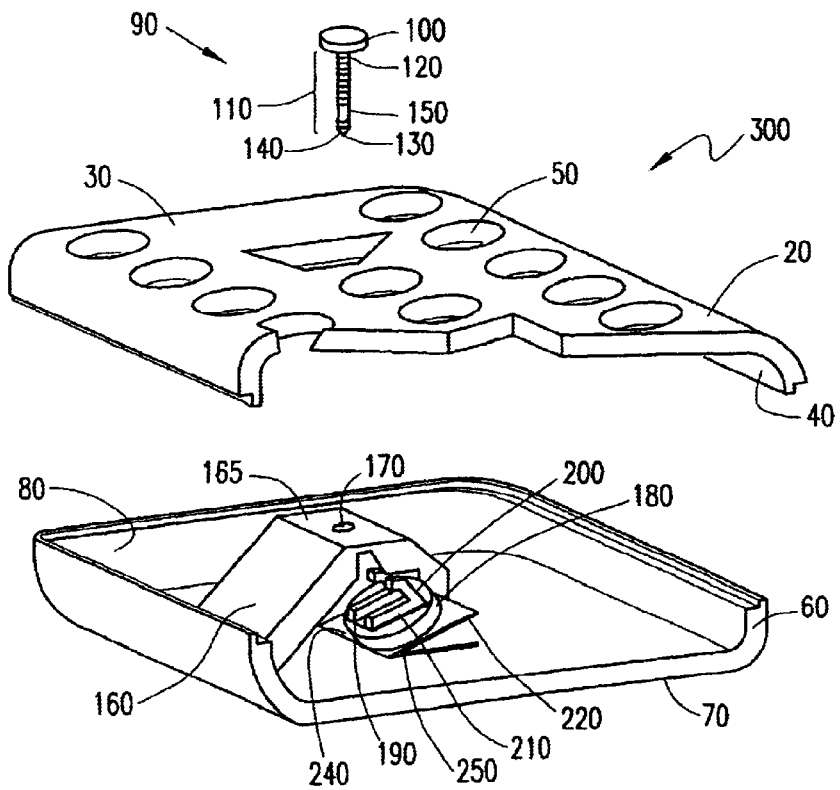
FIG. 2 is an exploded view of a second embodiment of the pin lock mechanism according to the principles of the present invention.

Referring now to FIG. 2, a mobile phone housing assembly 300 is shown in a second embodiment. The main difference between the mobile phone housing assembly 300 and the mobile phone housing assembly 10 is that the pin 90 is coupled through the first housing portion 20 on the external surface 30, thus making the pin 90 visible to a user.

Figure 3:
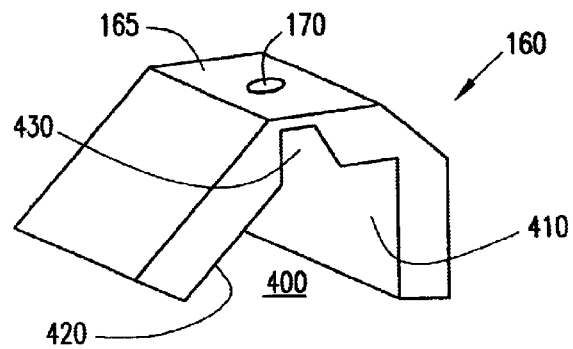
FIG. 3 is an isometric view of a pin-engaging mechanism housing according to one embodiment of the present invention.

Referring now to FIG. 3, an isometric view of the pin-lock housing 160 is shown. The pin-lock housing 160 defines a cavity 400 adapted to receive the pin lock 180 (FIG. 1) therein. In this embodiment, a first wall 410 of the pin-lock housing 160 is substantially perpendicular to the internal surface 80 (FIG. 1) of the second housing portion 60 (FIG. 1), while a second wall 420 of the pin-lock housing forms an acute angle with respect to the internal surface 80. It is contemplated that the second wall 420 may be parallel to the first wall 410, depending on the requirements of the user. A tapered portion 430 may be provided on the pin-lock housing 160 to facilitate engagement with the pin 90 (FIG. 1).

Figure 4C:
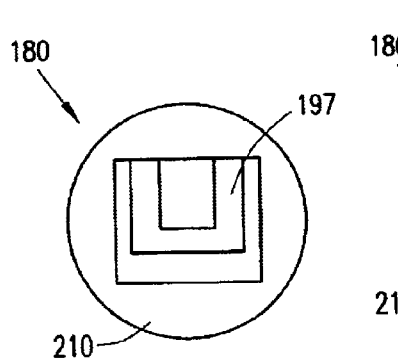
FIG. 4C is a top plan view of a pin-engaging mechanism and base according to an alternate embodiment of the present invention.
Figure 4A:
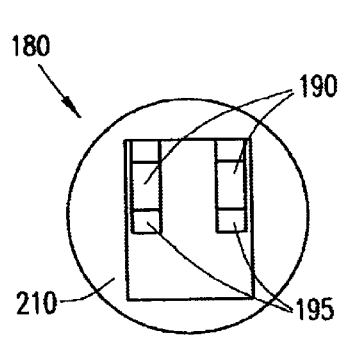
FIG. 4A is a top plan view of a pin-engaging mechanism and base according to one embodiment of the present invention.
Figure 4B:
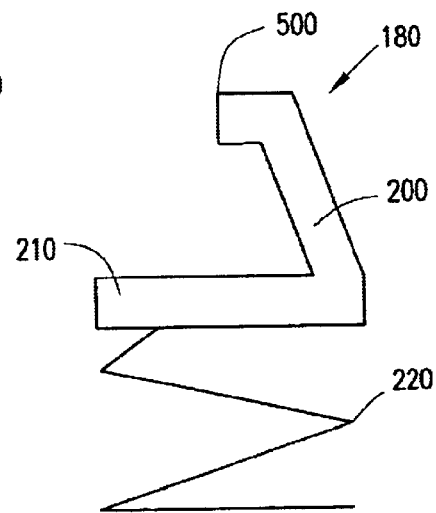
FIG. 4B is a side plan view of the pin-engaging mechanism and base of FIG. 4A coupled to a resilient member.

Referring now to FIGS. 4A and 4B, the pin lock 180 is shown in a top plan view and a side view, respectively. The pin lock 180 includes the pin-engaging mechanism 190 and the metallic base portion 210. A resilient member 220, in this case a spring, is shown coupled to the metallic base portion 210. While any number of materials may be used for the base portion 210, the materials must be capable of being acted upon by a magnet. Best seen in FIG. 4B, substantially vertically disposed legs 200 may be provided as the pin-engaging mechanism 190. The legs 200 may terminate in a coupling portion 500 adapted to mate with the locking portion 150 of the pin 90 (FIG. 1). The legs 200 thereby couple the pin 90 thereto upon engagement with the locking portion 150. It can be appreciated that although the pin-engaging mechanism 190 may comprise multiple flanges 195 and is shown as two components, a single component 197 as shown in FIG. 4C may be used with at least equal efficiency.

Figure 5:
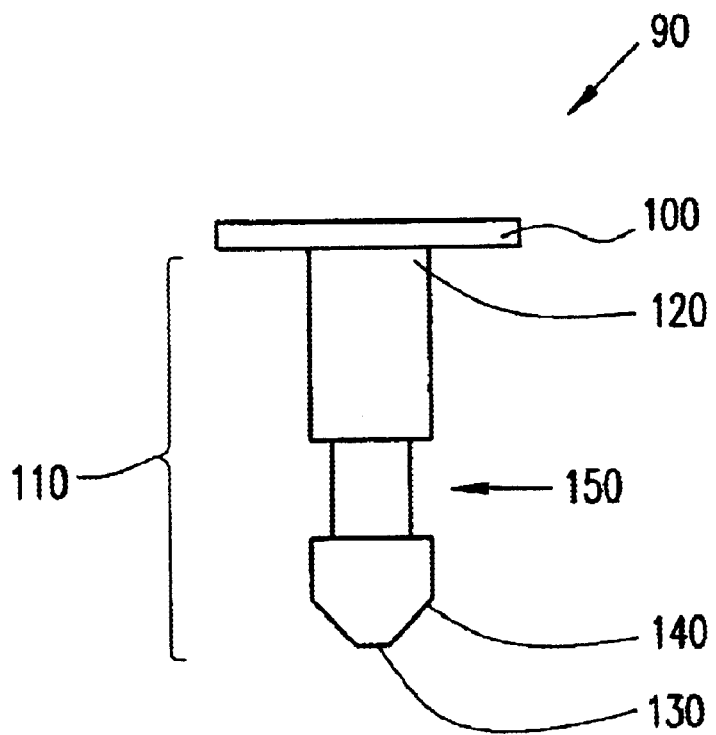
FIG. 5 is a side plan view of the pin according to one embodiment of the present invention.

Referring now to FIG. 5, an enlarged side plan view of the pin 90 according to one embodiment of the present invention is shown. The locking portion 150 is seen as a reduction in diameter of the shank 110, and is proximally located near the second end 130 of the pin 90. Tapers 140 are provided at about the second end 130 to facilitate engagement with the pin-engaging mechanism 190 (FIGS. 4A and 4B). The tapers 140 help bias the pin-engaging mechanism 190 away from the shank 110 until the pin-engaging mechanism 190 meets the locking portion 150, wherein the pin 90 becomes locked or coupled to the pin-engaging mechanism 190. The pin head 100 may be cylindrical, substantially cylindrical, rectangular or any other shape, depending on the requirements of the user.

Figure 6:
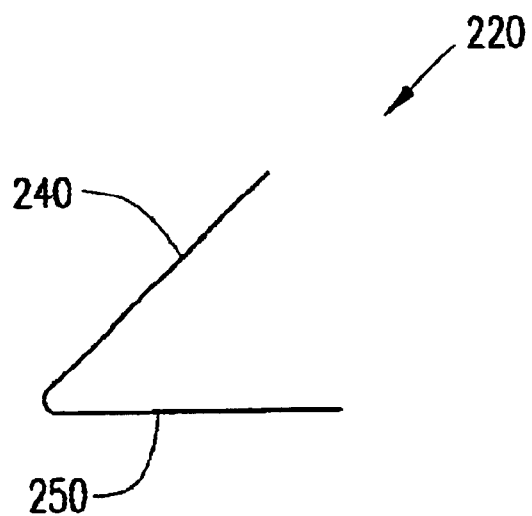
FIG. 6 is an alternate embodiment of the resilient member shown in FIG. 4A.

Referring now to FIG. 6, an enlarged side view of the resilient member 220 is shown as an angle having first end 240 in a first plane and second end 250, which is preferably coupled to the second housing portion 60 (FIG. 1) in a second plane. The angle of the first end 240 with respect to the second end 250 is preferably acute. The resilient member may also be metallic, such that application of a magnet on the second end 250 will move the first end 240 towards the second end 250. The resilient member 220 may be a spring, a spring-damper combination, or any other resilient structure capable of deformation to interlock with the pin 90, yet capable of releasing the pin 90 after application of a magnet thereto.

Figure 7:
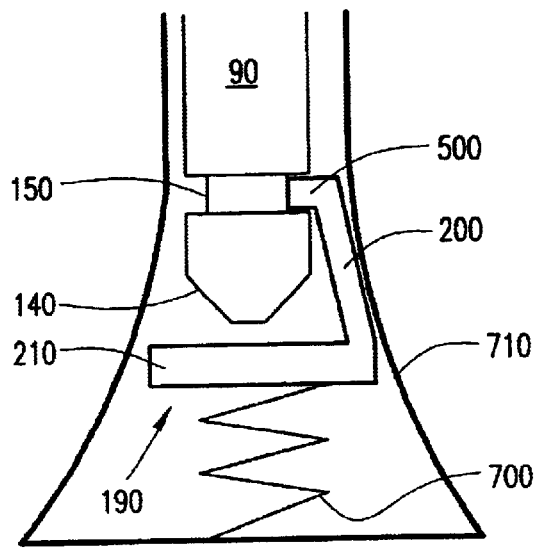
FIG. 7 is a side plan view of the pin-engaging mechanism coupled to a pin and a resilient member as located in an exemplary pin-engaging mechanism housing.

Referring now to FIG. 7, a side plan view of the pin-engaging mechanism 190 coupled to a pin 90 and one embodiment of a resilient member 700 as located in an exemplary pin-engaging mechanism housing 710 is shown. As seen in this embodiment, coupling portion 500 of pin-engaging mechanism 190 mates with locking portion 150 of pin 90 to couple the pin thereto. Resilient member 700 is seen in an extended position, but may contract as well, thus providing flexibility in the connection between the pin 90 and pin-engaging mechanism 190.

Figure 8:
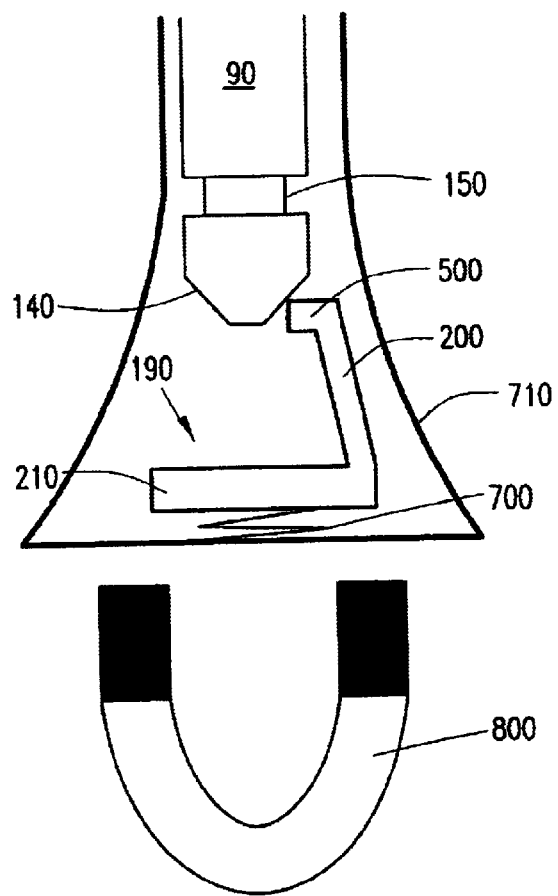
FIG. 8 is a side plan view of the pin-engaging mechanism in a fixed position relative to an external member during decoupling of the pin from the pin-engaging mechanism.

Referring now to FIG. 8, there is shown a side plan view of the pin-engaging mechanism 190 in a separation configuration relative to the pin 90 during decoupling of the pin 90 from the pin-engaging mechanism 190. As can be seen, a magnet 800 is applied to the pin-engaging mechanism housing 710 and attracts the pin-engaging mechanism 190 in the direction of the magnetic force. The force is strong enough to separate the pin 90 from the pin-engaging mechanism 190, which allows the pin 90 to separate from the pin-engaging mechanism 190. Because the resilient member 700 may be metallic, the resilient member 700 may also be attracted by the magentic force of the magnet 800. This feature thus allows quick coupling and decoupling of external components described above.

Figure 9:
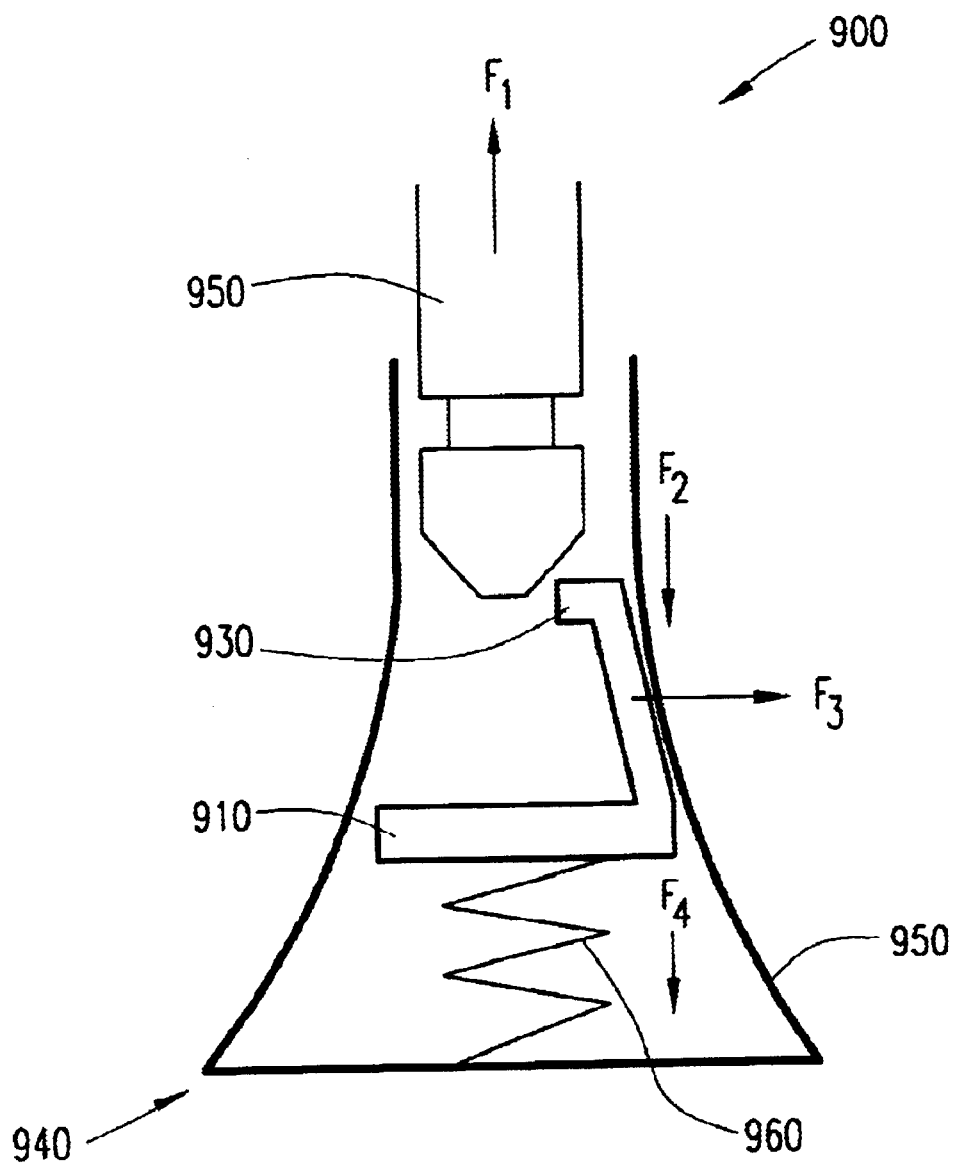
FIG. 9 is a side plan view of an alternate embodiment of the present invention in a decoupling configuration.

Referring now to FIG. 9, there is shown a side plan view of a pin lock 900 in an alternate separation configuration embodiment. In this embodiment, different non-metallic materials, such as thermoplastics and the like, may be used to construct a pin lock 910 or a pin engaging mechanism 930, thereby eliminating the dependency of the decoupling of the pin 920 and the pin lock 910 on a magnet (not shown). The pin lock 910 is shown in a similar configuration as pin lock 180, and one or more pin-engaging mechanisms 930 may be included. As in prior embodiments, a pin lock housing 940 is adapted to receive the pin lock 910 and pin 950. The pin 950 may be adapted to mate with the pin-engaging mechanism 930 in manner similar to that described above. Optionally, a resilient member 960 is shown coupled to the pin lock 910 and the pin lock housing 940.

In this embodiment, the pin lock housing 940 is designed to resist sufficient force, such that in order to decouple pin 950 from the pin lock 910, a first force F1 is applied in the direction indicated in FIG. 9. A resistive force in the direction indicated by F2 naturally occurs between the-pin lock 910 and the pin 950. Supplementing this resistive force F2, the pin lock housing wall 950 will contact the pin lock 910, which will create force F3, and resist force F1 in the same direction as F2. Finally and optionally, the resilient member 960 will provide force F4 to resist F1 and aid in the decoupling of the pin lock 910 from the pin 950. It can be appreciated that instead of the resilient member 960, an alternate coupling means may be provided to couple the pin lock 910 to the pin lock housing 940. Accordingly, the interaction between the pin lock housing wall 950, the pin lock 910, the optional resilient member 960 and the pin 950 will provide sufficient decoupling force to remove the pin 950 from the pin lock 910.

The previous description is of a preferred embodiment for implementing the invention, and the scope of the invention should not necessarily be limited by this description. The scope of the present invention is instead defined by the following claims.

What is claimed is:

1. A fastening mechanism, comprising:
   a pin having a head;
   a shank coupled to said head at a first end of said shank;
   a metallic pin-lock having a base portion coupled to a resilient pin-engaging portion;
   said shank having a circumferentially-formed notch at a second end, said notch being adapted to receive said resilient pin-engaging portion;
   a spring coupled to said base portion of said metallic pin-lock and to a mobile phone housing;
   a retainer housing said fastening mechanism;
   wherein, upon insertion of said pin into said pin-lock, said pin is adapted to move said resilient pin-engaging portion a predetermined distance until said resilient pin-engaging portion engages said circumferentially-formed notch; and
   wherein said pin-lock is adapted to be removed from said pin via a magnet attracting at least a portion of said pin-lock away from said pin.

2. The fastening mechanism of claim 1, wherein said pin-engaging portion comprises a plurality of legs, each leg terminating at a pin interlocking portion.

3. The fastening mechanism of claim 1, wherein said retainer housing is a mobile phone housing.

4. The fastening mechanism of claim 1, wherein said resilient pin-engaging portion is a spring.

5. The fastening mechanism of claim 1, wherein said resilient pin-engaging portion is comprised of an angle, said base being coupled to said angle disposing said base at an acute angle relative to a mobile phone housing.

6. A fastening mechainsm, comprising:
   a pin having a head;
   a shank coupled to said head at a first end of said shank;
   a non-metallic pin-lock having a base portion coupled to a resilient pin-engaging portion;
   said shank having a circumferentially-formed notch at a second end, said notch being adapted to receive said resilient pin-engaging portion;
   a coupling member coupled to said base portion of said non-metallic pin-lock and to a mobile phone housing;
   a retainer housing said fastening mechanism;
   wherein, upon insertion of said pin into said pin-lock, said pin is adapted to move said resilient pin-engaging portion a predetermined distance until said resilient pin-engaging portion engages said circumferentially-formed notch; and
   wherein said pin-lock is adapted to be removed from said pin via interaction between a first pre-determined force between said pin and said pin lock, a second predetermined force between said pin lock and said retainer, said retainer being adapted to resist said first predetermined force, a third predetermined force between said retainer and said pin lock, and a fourth predetermined force between said coupling member and said retainer.

7. The fastening mechanism of claim 6, wherein said resilient pin-engaging portion is metallic.

8. The fastening mechanism of claim 6, wherein said pin-engaging portion is comprised of a plurality of legs are disposed at an acute angle relative to said base.

* * * * *